United States Patent [19]

Raghunathan et al.

[11] Patent Number: 4,689,504
[45] Date of Patent: Aug. 25, 1987

[54] HIGH VOLTAGE DECODER

[75] Inventors: Kuppuswamy Raghunathan, Austin, Tex.; Jeffrey R. Jorvig, Chandler; Stephen L. Smith, Tempe, both of Ariz.

[73] Assignee: Motorola, Inc., Schaumburg, Ill.

[21] Appl. No.: 811,227

[22] Filed: Dec. 20, 1985

[51] Int. Cl.[4] .................. G11C 80/00; H03K 19/092; H03K 17/687
[52] U.S. Cl. ..................... 307/449; 307/475; 307/200 B; 307/585; 307/264
[58] Field of Search ............. 307/200 B, 443, 264, 307/576, 279, 579, 585, 584

[56] References Cited

U.S. PATENT DOCUMENTS

| | | | |
|---|---|---|---|
| 3,942,043 | 3/1976 | Sirocka et al. | 307/264 |
| 4,468,576 | 8/1984 | Takemac | 307/481 |
| 4,508,978 | 4/1985 | Reddy | 307/482 |

*Primary Examiner*—Stanley D. Miller
*Assistant Examiner*—M. R. Wambach
*Attorney, Agent, or Firm*—John A. Fisher; Jeffrey Van Myers

[57] ABSTRACT

A high voltage CMOS decoder and level translator for use in conjunction with EPROMS and EEPROMS utilizes additional series coupled field effect transistors maintained in an on condition so a to prevent the voltage across the pull-up and pull-down field effect transistors from exceeding their break down voltages. For example, in addition to a pull-up P-channel field effect transistor and a pull-down N-channel field effect transistor in the output inverter circuit, additional P-channel and N-channel field effect transistors are coupled in series between the pull-up and pull-down transistors to maintain the voltage across the pull-up and pull-down transistors from exceeding there breakdown voltages.

5 Claims, 1 Drawing Figure

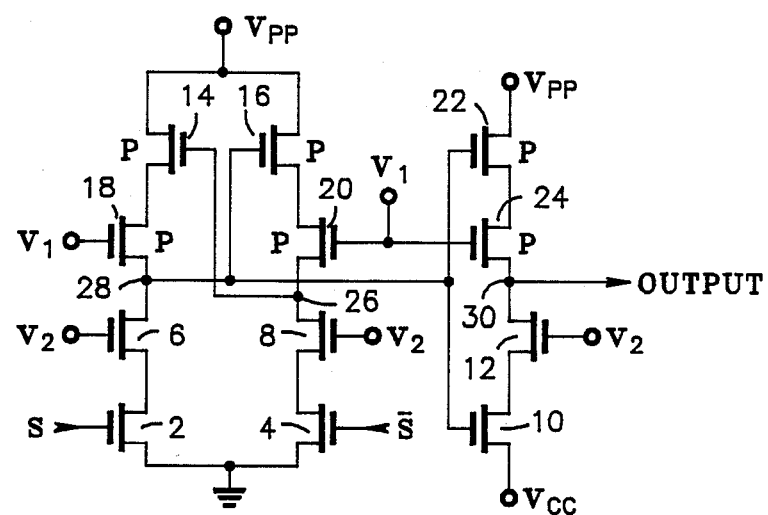

HIGH VOLTAGE DECODER

BACKGROUND OF THE INVENTION

This invention relates generally to a high speed complimentary metal oxide semiconductor (HCMOS) decoder circuit and, more particularly, to a high speed HCMOS decoder which will permit logic operation at voltages greater than the breakdown voltages inherent in the semiconductor manufacturing process.

While typically a CMOS circuit will break down at, for example, 18 volts, occasionally it is necessary to operate such a circuit at voltages higher than the breakdown voltage. For example, non-volatile memories (e.g. EPROMS and EEPROMS) require a high programming voltage which, in the past, has been limited by the gate-aided junction breakdown (i.e. the drain-to-substrate breakdown voltage with the gate shorted to the source). These higher programming voltages are necessary to achieve satisfactory program and erase times. Gate induced electric fields inherent in the HCMOS process further aggravate the breakdown problem in that a field-effect-transistor (FET) in its off state may be subject to maximum chip voltage.

SUMMARY OF THE INVENTION

It is an object of the present invention to provide an improved decoder for use in conjunction with EPROMS and EEPROMS.

It is a further object of the present invention to provide an improved level translator.

It is a still further object of the present invention to provide a high voltage decoder which avoids the problems associated with gate-aided junction breakdown.

According to a broad aspect of the invention there is provided the high voltage CMOS decoder and level translator, comprising a first N-channel field effect transistor having a source electrode for coupling to a first source of supply voltage, a gate electrode for receiving an input signal capable of assuming first and second stable states and having a drain electrode; a second N-channel field effect transistor having a source coupled to said first source of supply voltage, a gate electrode coupled to the compliment of said input signal and having a drain electrode; a first P-channel field effect transistor having a source for coupling to a second source of supply voltage substantially higher than said first source of supply voltage and having gate and drain electrodes; a second P-channel field effect transistor having a source for coupling to said second source of supply voltage; first means coupled between the drain of said first N-channel field effect transistor and the drain of said first P-channel field effect transistor for preventing the voltage across said first N-channel field effect transistor and said first P-channel field effect transistor from exceeding their breakdown voltage; and second means coupled between the drain of said second N-channel field effect transistor and a drain of said second P-channel field effect transistor from exceeding their breakdown voltage, the gate of said first P-channel transistor being coupled to said second means and the gate electrode of said second P-channel field effect transistors being coupled to said first means.

BRIEF DESCRIPTION OF THE DRAWINGS

The above and other objects, features and advantages of the present invention will be more clearly understood from the following detailed description taken in conjunction with the accompanying drawing which is a schematic diagram of the inventive high voltage decoder.

DESCRIPTION OF THE PREFERRED EMBODIMENT

The inventive level translator and high voltage decoder comprises N-channel field effect transistors 2, 4, 6, 8, 10 and 12, and P-channel field effect transistors 14, 16, 18, 20, 22 and 24. It is to be noted at the onset that the N type wells of the P-channel field effect transistors are tied to $V_{PP}$ (typically 20 volts) as are the source terminals of P-type transistors 14, 16 and 22.

Input transistors 2 and 4 each have source terminals coupled to ground. The gate of transistor 2 is coupled to an input signal (S), and the gate of transistor 4 is coupled to a complimentary input signal ($\bar{S}$). The drain electrodes of transistors 2 and 4 are coupled respectively to the source electrodes of transistors 6 and 8 each of which have a gate electrode coupled to a voltage $V_2$ which will be described more fully below.

The source electrodes of P-channel transistors 14 and 16 are coupled respectively to the drain electrode of P-channel transistors 18 and 20. The gate electrode of transistor 14 is coupled to node 26, and a gate electrode of transistor 16 is coupled to node 28 which is also coupled to the gate electrodes of N-channel transistor 10 and P-channel transistor 22. The drain electrodes of P-channel transistors 18 and 20 are coupled respectively to the drain electrodes of N-channel transistors 6 and 8. The gate electrodes of P-channel transistors 18 and 20 are coupled to a source of voltage $V_1$ as is the gate of P-channel transistor 24.

The source electrode of P-channel transistor 22 is coupled to the drain of P-channel transistor 24, the source of which provides the circuit output for memory row decoding. The source of N-channel transistor 10 is coupled to supply voltage $V_{CC}$ (typically 5 volts). N-channel transistor 10 has a drain coupled to the source of N-channel transistor 12 which has a gate coupled to $V_2$ and a drain coupled to output node 30.

Voltages $V_1$ and $V_2$ are chosen to be approximately 10 volts. As a result, N-channel transistors 6, 8 and 12 remain in an on condition. Furthermore, since the N wells of P-channel transistors 18, 20, and 24 are coupled to $V_{PP}$ (e.g. 20 volts) a potential of 10 volts on their gate will cause transistors 18, 20, and 24 to remain on.

Input signal S and $\bar{S}$ can assume logical high (typically 5 volts) and logical low (typically 0 volts) states. Thus, for example, if S is high and $\bar{S}$ is low transistors 2 and 4 will be on and off respectively. Since transistor 6 is on, a low voltage will appear at node 28 and therefore at the gate electrodes of P-channel transistors 16 and 22 and N-channel transistor 10. A low voltage at the gate of transistor 16 will cause it to turn on, and since transistor 20 is likewise on, a voltage substantially equal to $V_{PP}$ will appear at node 26 and therefore at the gate of P-channel transistor 14. This maintains P-channel transistor 14 off.

The low voltage appearing at node 28 will cause transistor 10 to remain off and transistor 22 to turn on. Since P-channel transistor 24 is also on, a high voltage (substantially 20 volts) will appear at output node 30. In summary, when S equals a logical low (zero volts) and $\bar{S}$ equals a logical high (5 volts), a high voltage (approximately 20 volts) will appear at output node 30. On the other hand, should S be high and $\bar{S}$ be low, transistor 2 will be off and transistor 4 will turn on. Since transistor 8 is likewise on due to its gate being coupled to $V_2$, a low voltage will appear at node 26 and also at the gate of P-channel transistor 14. This causes transistor 14 to turn on. Since transistor 18 is on, a voltage substantially equal to $V_{PP}$ (20 volts) will appear at node 28. This causes transistor 10 to be turned on and transistors 16 and 22 to be turned off. With transistors 10 and 12 on, output node 30 is pulled down to $V_{CC}$ (approximately 5 volts). Thus, when (S) and S are low and high respectively, five volts will appear at output node 30.

It should be apparent, that the output voltages appearing at node 30 have been translated up to a value sufficient to perform the required row decoding.

P channel transistors 18, 20 and 24 and N-channel transistors 6, 8 and 12 do not effect the logical functioning of the circuit since they are always on. However, they render the overall circuit less susceptible to breakdown problems. That is, when node 26 is at substantially 20 volts, the source of transistor 8 is at approximately one gate to source threshold below its gate voltage. That is, the source of device 8 is at approximately nine volts. Thus, the voltage across transistor 4 is substantially less than its breakdown voltage. The gate-aided breakdown voltage of device 8 is enhanced by its higher gate voltage. When node 28 is at zero volts, a similar phenomenon occurs with respect to transistors 14 and 18.

When node 26 is at zero volts, a similar phenomenon occurs at transistors 16 and 20, and when the voltage is at node 28 is substantially 20 volts, the same phenomenon occurs at transistors 2 and 6.

Series coupled transistors 24 and 12 provide a similar function in the output portion of the circuit. In this manner, the three pairs of series coupled devices (i.e. 6, 18; 8, 20; and 12, 24) do not alter the logical functioning of the circuit in any manner; however, they serve to prevent destructive breakdown voltages.

The above description is given by way of example only. Changes in form and details may be made by one skilled in the art without departing from the scope of the invention as defined by the appended claims.

We claim:

1. The high voltage CMOS decoder and level translator, comprising:
   a first N-channel field effect transistor having a source electrode for coupling to a first source of supply voltage, a gate electrode for receiving an input signal capable of assuming first and second stable states and having a drain electrode;
   a second N-channel field effect transistor having a source electrode for coupling to said first source of supply voltage, a gate electrode coupled to the complement of said input signal and having a drain electrode;
   a first P-channel field effect transistor having a source electrode for coupling to a second source of supply voltage higher than said first source of supply voltage and having gate and drain electrodes;
   a second P-channel field effect transistor having a source electrode for coupling to said second source of supply voltage and having gate and drain electrodes;
   a third N-channel field effect transistor having a source electrode coupled to the drain electrode of said first N-channel field effect transistor, a gate electrode for coupling to a third source of supply voltage intermediate said first and second sources of supply voltage and having a drain electrode;
   a third P-channel field effect transistor having a source electrode coupled to the drain electrode of said first P-channel field effect transistor, a drain electrode coupled to the drain electrode of said third N-channel field effect transistor and to the gate of said second P-channel field effect transistor to thereby provide an output node for said input signal, and a gate electrode coupled to a fourth source of supply voltage intermediate said first and second sources of supply voltage;
   a fourth N-channel field effect transistor having a source electrode coupled to the drain electrode of said second N-channel field effect transistor, a gate electrode for coupling to said third source of supply voltage and having a drain electrode; and
   a fourth P-channel field effect transistor having a source electrode coupled to the drain electrode of said second P-channel field effect transistor, a drain electrode coupled to the drain electrode of said fourth N-channel field effect transistor and to the gate electrode of said first P-channel field effect transistor, and a gate electrode coupled to said fourth source of supply voltage.

2. A circuit according to claim 1 further comprising:
   a fifth N-channel field effect transistor having a source electrode for coupling to a fifth source of supply current, a gate electrode coupled to said output node and having a drain electrode;
   a fifth P-channel field effect transistor having a source electrode for coupling to said second source of supply voltage, a gate electrode coupled to the drain electrode of said third N-channel field effect transistor and having a drain electrode;
   a sixth N-channel field effect transistor having a source electrode coupled to the drain electrode of said fifth N-channel field effect transistor, a gate electrode for coupling to said third source of supply voltage and having a drain electrode; and
   a sixth P-channel field effect transistor having a source electrode coupled to the drain electrode of said fifth P-channel field effect transistor, a drain electrode coupled to the drain electrode of said sixth N-channel field effect transistor and having a gate electrode for coupling to said fourth source of supply voltage.

3. A circuit according to claim 2 wherein said circuit has an output taken from the drain of said sixth P-channel field effect transistor.

4. A circuit according to claim 3 wherein said first source of supply voltage is approximately ground and said second source of supply voltage is approximately 20 volts.

5. A circuit according to claim 4 wherein said fourth and fifth sources of supply voltage are approximately 10 volts.

* * * * *